(12) United States Patent
Lim

(10) Patent No.: US 10,074,412 B2
(45) Date of Patent: Sep. 11, 2018

(54) SEMICONDUCTOR MEMORY DEVICE AND METHOD FOR OPERATING THE SAME

(71) Applicant: SK hynix Inc., Gyeonggi-do (KR)

(72) Inventor: Sang Oh Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/628,861

(22) Filed: Jun. 21, 2017

(65) Prior Publication Data

US 2018/0144781 A1 May 24, 2018

(30) Foreign Application Priority Data

Nov. 21, 2016 (KR) ........................ 10-2016-0154976

(51) Int. Cl.
*G11C 11/00* (2006.01)
*G11C 7/22* (2006.01)
*G11C 7/04* (2006.01)

(52) U.S. Cl.
CPC . *G11C 7/22* (2013.01); *G11C 7/04* (2013.01)

(58) Field of Classification Search
CPC ... G11C 7/222; G11C 29/023; G11C 13/0004; G11C 13/0061; G11C 13/0069; G11C 29/028; G11C 13/0064; G11C 2013/0092; G11C 29/12015
See application file for complete search history.

(56) References Cited

U.S. PATENT DOCUMENTS

| 8,130,024 B2* | 3/2012 | Zimlich | H03L 7/0814 327/512 |
|---|---|---|---|
| 2010/0226189 A1* | 9/2010 | Choi | G11C 7/04 365/194 |
| 2012/0092039 A1* | 4/2012 | Lee | G11C 7/02 326/30 |
| 2012/0105107 A1* | 5/2012 | Moon | H03D 13/00 327/40 |
| 2014/0368249 A1* | 12/2014 | Lee | H03K 5/131 327/262 |

FOREIGN PATENT DOCUMENTS

| KR | 1020130085311 | 7/2013 |
|---|---|---|
| KR | 1020140030568 | 3/2014 |

* cited by examiner

*Primary Examiner* — Hien Nguyen
(74) *Attorney, Agent, or Firm* — IP & T Group LLP

(57) ABSTRACT

Provided herein may be a semiconductor memory device and a method of operating the same. The semiconductor memory device may include a delay code determining unit configured to output a final delay trim code reflecting process, voltage and temperature (PVT) conditions of the semiconductor memory device, using an internal clock generated for a reference time and a delay circuit configured to reflect a delay of a data line on a clock signal in response to the final delay trim code.

14 Claims, 9 Drawing Sheets

SEMICONDUCTOR MEMORY DEVICE AND METHOD FOR OPERATING THE SAME

CROSS-REFERENCE TO RELATED APPLICATION

The present application claims priority under 35 U.S.C. § 119(a) to Korean patent application number 10-2016-0154976 filed on Nov. 21, 2016 In the Korean Intellectual Property Office, the entire disclosure of which is incorporated herein by reference.

BACKGROUND

Field of Invention

Various embodiments of the present disclosure generally relate to an electronic device, and more particularly, to a semiconductor memory device and a method for operating the same.

Description of Related Art

Semiconductor memory devices are memory devices embodied using a semiconductor such as silicon (Si), germanium (Ge), gallium arsenide (GaAs), indium phosphide (InP), or the like. Semiconductor memory devices are classified into volatile memory devices and nonvolatile memory devices.

The volatile memory device is a memory device in which data stored therein is lost when power is interrupted. Representative examples of the volatile memory device include static random access memory (SRAM), dynamic RAM (DRAM), synchronous DRAM (SDRAM), etc. The nonvolatile memory device is a memory device which retains data stored therein even when power is cut off. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memory is classified into a NOR type memory and a NAND type memory.

SUMMARY

Various embodiments of the present disclosure are directed to a semiconductor memory device capable of more stable operation, and a method for operating the same.

An embodiment of the present disclosure may provide for a semiconductor memory device including: a delay code determining unit configured to output a final delay trim code reflecting process, voltage and temperature (PVT) conditions of the semiconductor memory device, using an internal clock generated for a reference time; and a delay circuit configured to reflect a delay of a data line on a clock signal in response to the final delay trim code.

An embodiment of the present disclosure may provide for a method for operating a semiconductor memory device including: reading a trimming code from a content addressable memory (CAM) block when power is supplied, and generating a reference clock according to the trimming code; generating an internal clock for a reference time, and determining a final delay trim code reflecting process, voltage and temperature (PVT) conditions of the semiconductor memory device based on the internal clock; and generating a delayed clock signal obtained by delaying an external clock by a delay of a data line based on the final delay trim code.

DETAILED DESCRIPTION

Figure 1:
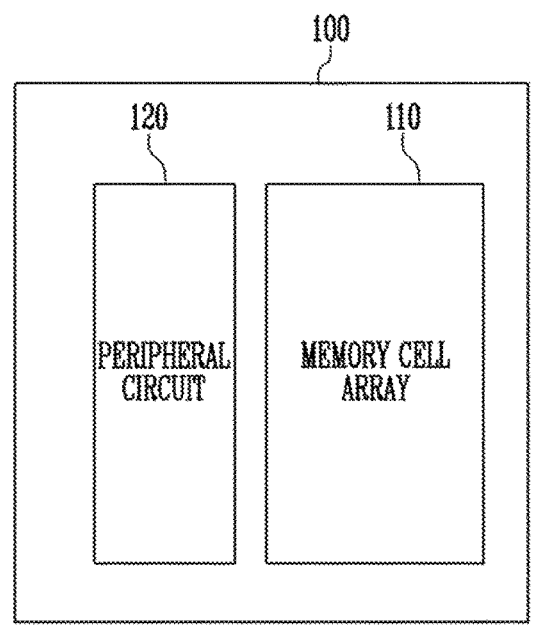
FIG. 1 is a block diagram illustrating a semiconductor memory device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings. [0027] It is also noted that in this specification, "connected/coupled" refers to one component not only directly coupling another component but also indirectly coupling another component through an intermediate component. On the other hand, "directly connected/ directly coupled" refers to one component directly coupling another component without an intermediate component.

FIG. 1 is a block diagram illustrating a semiconductor memory device 100.

Referring to FIG. 1, the semiconductor memory device 100 may take many alternative forms, such as a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In addition, the semiconductor memory device 100 according to the present disclosure may be implemented as a three-dimensional array structure. The present disclosure may also be applied not only to a flash memory in which a charge storage layer is formed of a conductive floating gate (FG), but also to a charge trap flash (CTF) memory in which a charge storage layer is formed of an insulating layer.

The semiconductor memory device 100 may include a memory cell array 100 and a peripheral circuit 120 for driving the memory cell array 110. The memory cell array 110 may include a plurality of nonvolatile memory cells.

The memory cell array 110 may include a plurality of memory blocks. Each memory block may include a plurality of memory cells. The memory cells included in each memory block may be defined as a plurality of pages. A single page may be defined as a plurality of memory cells coupled to the same word line.

The peripheral circuit 120 may be operated under the control of an external controller (not shown). The peripheral circuit 120 may program data to the memory cell array 110 under the control of the external controller. The peripheral circuit 120 may be operated to read data from the memory cell array 110 or erase data from the memory cell array 110.

Figure 2:
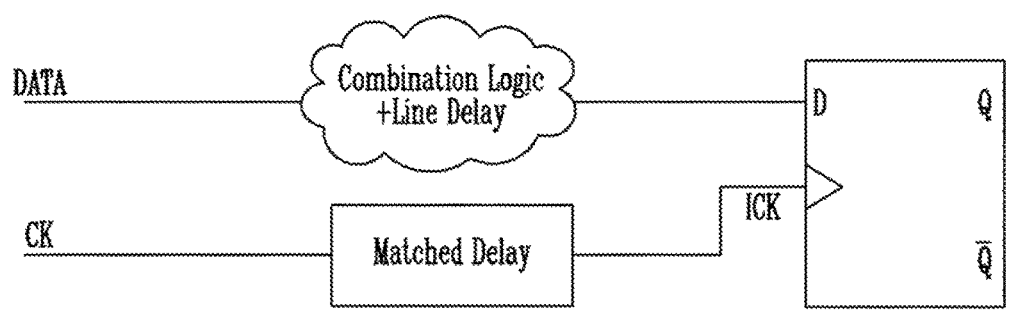
FIG. 2 is a block diagram illustrating data and a clock signal which are inputted to a semiconductor memory device.

FIG. 2 is a block diagram illustrating data and a clock signal which are inputted to a semiconductor memory device.

Referring to FIG. 2, the semiconductor memory device may receive an external clock CK and data DATA from an external device (not shown). In an embodiment, the data DATA and the external clock CK shown in FIG. 2 may also be used when the semiconductor memory device outputs data read from internal memory cells to the external controller.

In detail, as the data DATA inputted to the semiconductor memory device or to be inputted thereto passes through several logics and a transmission line, a delay may be generated. In the semiconductor memory device, an internal clock ICK for receiving data DATA inputted from the external device may be generated by delaying the external clock CK by a matched delay so as to compensate for a delay generated in transmission of the data DATA. For example, the semiconductor memory device may reflect, on the external clock CK, a matched delay having the same amount as that of a delay generated in the combination logic and line during transmission of the data DATA, and then generate the internal clock ICK.

Furthermore, a delay generated in the combination logic and the line may be applied to the external clock CK, and a matched delay having the same amount as that of the delay may be reflected on the data DATA.

The matched delay is applied only as a delay equal to the delay of the combination logic and the line, but does not reflect variation in Process, Voltage and Temperature (PVT) conditions hereinafter, referred to as "PVT variation", of the semiconductor memory device. Therefore, a difference in timing between the two delays that are applied to the data DATA and the external clock CK may be rapidly increased by the PVT variation of the semiconductor memory device.

A latch of FIG. 2 may denote a data input circuit for receiving the data DATA in synchronization with the internal clock ICK.

Figure 3:
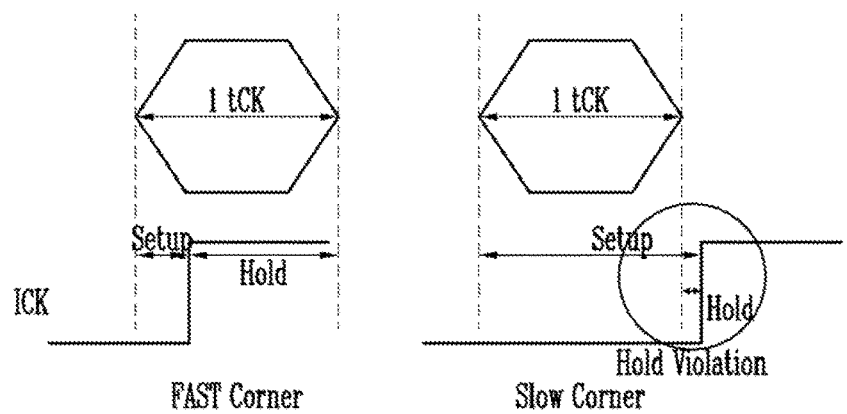
FIG. 3 is a block diagram illustrating setup/hold times of an internal clock depending on variation in PVT conditions of a semiconductor memory device.

FIG. 3 is a block diagram illustrating setup/hold times of an internal clock ICK depending on the PVT conditions of the semiconductor memory device.

The PVT conditions of the semiconductor memory device may vary depending on, for example, an imbalance of doping during a wafer process, a voltage drop while current passes through several devices during supply of power, or temperature conditions of a path along which a signal passes. Impedance of an output terminal of the semiconductor memory device may vary depending on the PVT conditions. A slow corner (SS) refers to PVT conditions when the impedance of the output terminal is at a minimum. A fast corner (FF) refers to PVT conditions when the impedance of the output terminal is at a maximum.

Under a low communication speed in which an operating frequency is low, 1 tCK has a comparatively long period. Therefore, although a mismatch occurs between the delays, setup/hold times of the internal clock ICK may be within 1 tCK.

However, under a high communication speed in which the operating frequency is high, 1 tCK has a comparatively short period. Therefore, even small PVT variation may cause an abnormal operation of the semiconductor memory device since the setup/hold times of the Internal clock ICK may be out of 1 tCK.

Referring to FIG. 3, in the case of the fast corner, the setup/hold times of the internal clock ICK may be within 1 tCK. However, in the case of the slow corner, hold time violation may be caused since the delay is biased to the setup time.

Figure 4:
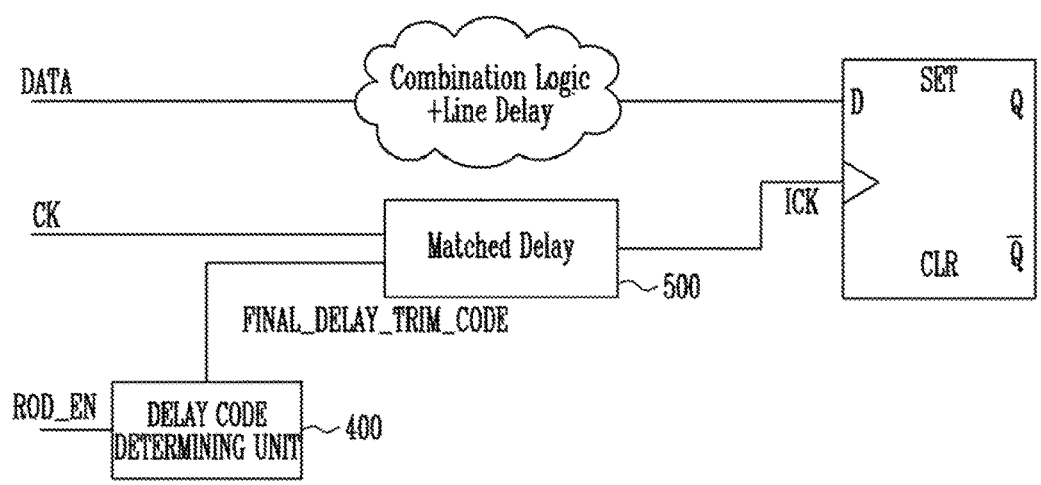
FIG. 4 is a block diagram illustrating an internal clock generator according to an embodiment of the present disclosure.

FIG. 4 is a block diagram illustrating an internal clock generator according to an embodiment of the present disclosure.

Referring to FIG. 4, in the semiconductor memory device according to the embodiment of the present disclosure, when an internal clock ICK may be generated, a final delay trim code FINAL_DELAY_TRIM_CODE which reflects PVT conditions may be applied to a matched delay 500 receiving an external clock CK. A latch of FIG. 4 may denote a data input circuit for receiving data DATA in synchronization with the internal clock ICK.

According to the present disclosure, to address the concern illustrated in FIG. 3, there may be provided a circuit for automatically trimming timing in the semiconductor memory device. In an embodiment, the semiconductor memory device may include a delay code determining unit 400.

To generate the internal clock ICK according to the PVT conditions, the delay code determining unit 400 may provide the final delay trim code FINAL_DELAY_TRIM_CODE according to the PVT conditions to a matched delay 500.

The delay code determining unit 400 may operate in response to a ring oscillator control signal ROD_EN. For reference, the delay code determining unit 400 may include a ring oscillator delay (ROD) circuit having a characteristic dependent on PVT variation, and the ring oscillator control signal ROD_EN may be used to enable the ROD circuit. The ring oscillator control signal ROD_EN may be enabled after an initial operation of the semiconductor memory device has been performed. An enable timing of the ring oscillator control signal ROD_EN will be described in more detail with reference to FIG. 5.

Figure 5:
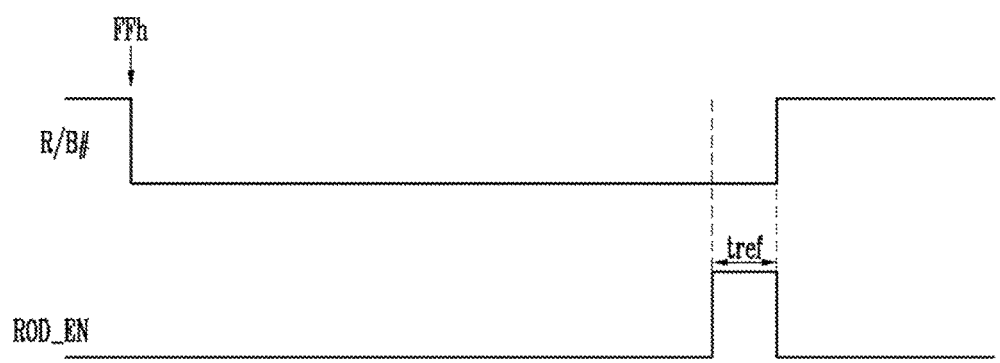
FIG. 5 is a view illustrating an enable timing of a ring oscillator enable signal of FIG. 4.

FIG. 5 is a view illustrating the enable timing of the ring oscillator enable signal ROD_EN of FIG. 4.

Referring to FIG. 5, the semiconductor memory device may perform an initial operation when power is supplied for example, a power up. The initial operation may be performed in response to an initial operation command FFh inputted from an external controller. In response to the initial operation command FFh, a ready/busy signal R/B#indicating whether it is a ready state or a busy state may transit into a logic low level to inform the external controller that the semiconductor memory device is in the busy state. While the initial operation is performed, the semiconductor memory device may read a content addressable memory (CAM) block among a plurality of memory blocks included in a memory cell array. In an embodiment, the initial operation command FFh may include a CAM auto read command, and the initial operation may be a CAM auto read operation.

Various kinds of setting information of the semiconductor memory device may be stored in the CAM block. For example, set conditions related to a data input/output operation, or other information may be stored in the CAM block. In an embodiment, information about the number of times of read/write operations (program/erase (P/E) Cycle), a bad column address, and a bad block address may be stored in the CAM block. In an embodiment, option information, for example, program voltage information, read voltage information, erase voltage information, or information about a thickness of an oxide layer of a cell gate, which is needed for the operation of the semiconductor memory device, may be stored in the CAM block.

The semiconductor memory device may include a reference clock which is typically used to provide a reference. Since the period of the reference clock must be very accurate, the controller directly performs a trimming operation on each die of the semiconductor memory device. In an embodiment, a trimming code which is used to the trimming operation may be stored in the CAM block.

During the initial operation, the semiconductor memory device may read the trimming code from the CAM block and perform the trimming operation for updating the reference clock based on the trimming code. Therefore, after the initial operation has been performed, the reference clock becomes a clock signal having a constant period regardless of the PVT conditions.

According to an embodiment of the present disclosure, after the initial operation, the semiconductor memory device may operate a ring oscillator delay (ROD) circuit included in the delay code determining unit 400 of FIG. 4, in response to a ring oscillator control signal ROD_EN. Furthermore, after power has been supplied and the initial operation has been performed, the semiconductor memory device may enable the ring oscillator control signal ROD_EN for a reference time tref. In an embodiment, the reference time tref may have a length corresponding to n times the period of the reference clock trimmed during the initial operation. In various embodiments, the reference time tref may be a time corresponding to ten times the period of the reference clock. For example, when a period of the trimmed reference clock refers to 100 ns, the semiconductor memory device may enable the ring oscillator control signal ROD_EN for 1 us which is ten times the period of the reference clock.

Figure 6:
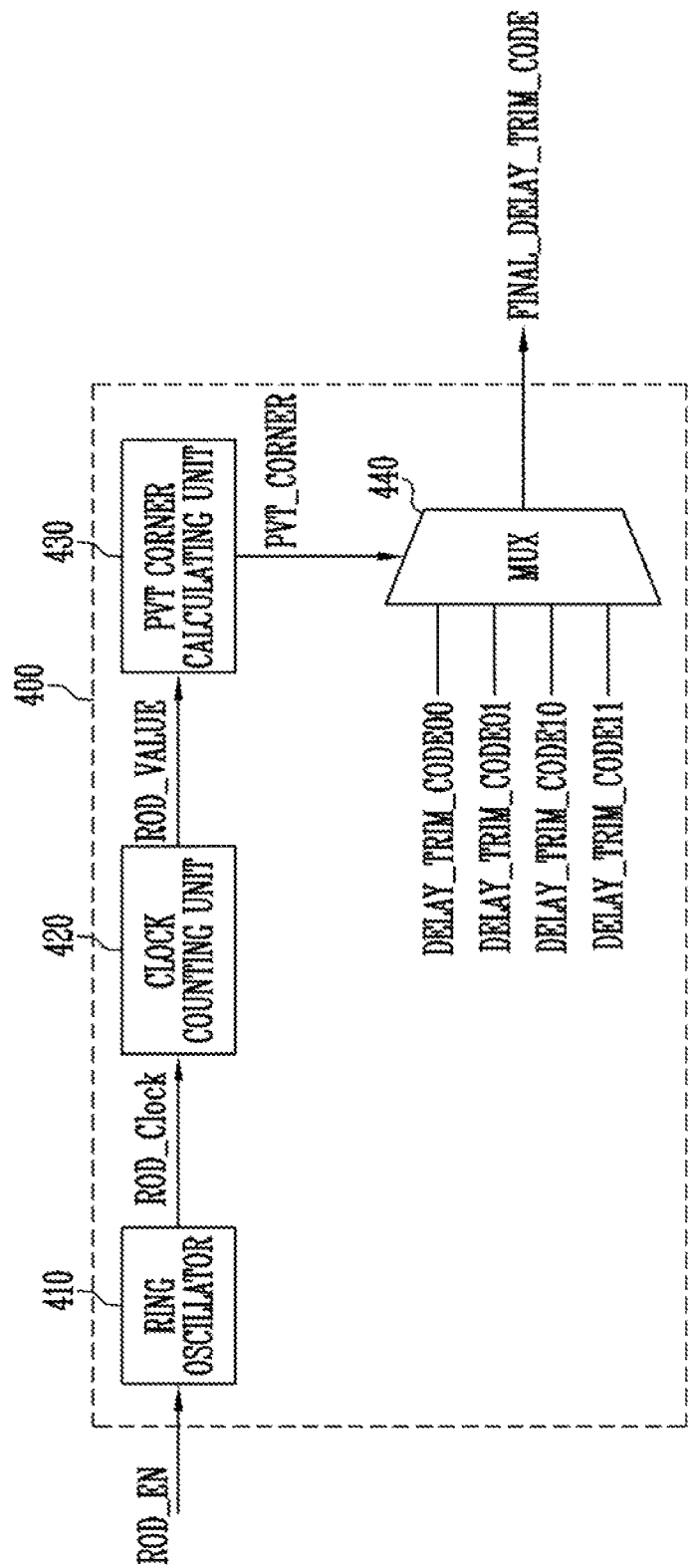
FIG. 6 is a block diagram illustrating a delay code determining unit of FIG. 4.

FIG. 6 is a block diagram illustrating the delay code determining unit 400 of FIG. 4.

Figure 7:
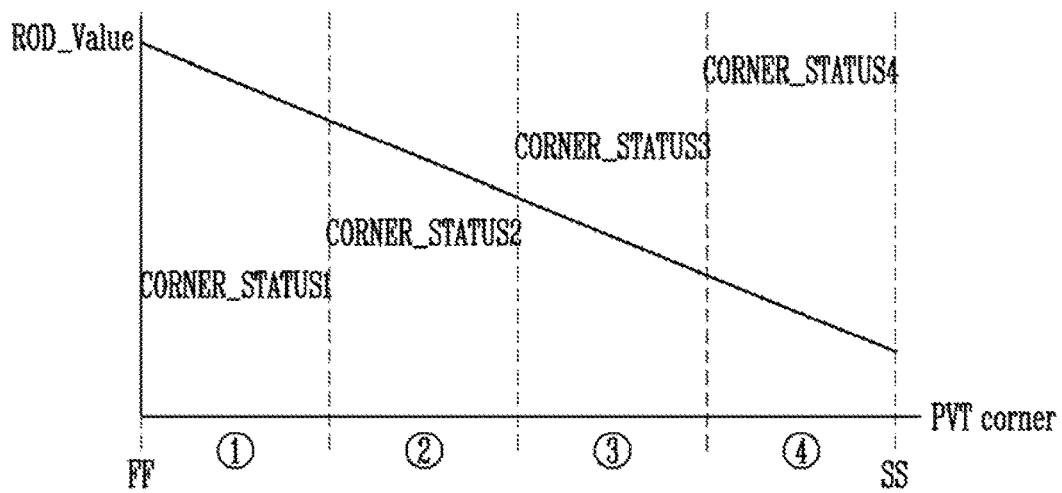
FIG. 7 is a graph illustrating variation of a status value of FIG. 6 according to PVT conditions.

FIG. 7 is a graph illustrating variation of a status value ROD_VALUE of FIG. 6 according to the PVT conditions.

Referring to FIG. 6, the delay code determining unit 400 may include a ring oscillator 410, a clock counting unit 420, a PVT corner calculating unit 430 and a delay trim code output unit (MUX) 440.

The ring oscillator 410 may receive a ring oscillator control signal ROD_EN. The ring oscillator control signal ROD_EN may be inputted in response to an initial operation that is performed after power is supplied to the semiconductor memory device.

The ring oscillator 410 may generate an oscillator clock signal ROD_Clock having a constant frequency while the ring oscillator control signal ROD_EN is inputted. The ring oscillator 410 may output the oscillator clock signal ROD_Clock to the clock counting unit 420. In an embodiment, the ring oscillator 410 may include a ring oscillator delay (ROD) circuit.

The clock counting unit 420 may receive the oscillator clock signal ROD_Clock from the ring oscillator 410. The clock counting unit 420 may count rising edges or falling edges of the oscillator clock signal ROD_Clock to generate a status value ROD_VALUE.

Referring to FIG. 7, the status value ROD_VALUE may change depending on the PVT conditions of the semiconductor memory device. For example, the period of the oscillator clock signal ROD_Clock generated in the ring oscillator 410 is lengthened toward the slow corner SS from ① to ④, whereby the counted status value ROD_VALUE may be reduced. In addition, as the PVT conditions of the semiconductor memory device becomes close to the fast corner FF from ④ to ①, the period of the oscillator clock signal ROD_Clock generated in the ring oscillator 410 is shortened, whereby the counted status value ROD_VALUE may be increased.

The clock counting unit 420 may output the generated status value ROD_VALUE to the PVT corner calculating unit 430.

The PVT corner calculating unit 430 may receive the status value ROD_VALUE from the clock counting unit 420.

The PVT corner calculating unit 430 may calculate, based on the status value ROD_VALUE, a corner status reflecting the PVT conditions of the semiconductor memory device, and generate a PVT corner value PVT_CORNER representing the corner status. The PVT corner calculating unit 430 may provide the PVT corner value PVT_CORNER to the delay trim code output unit 440.

For example, referring to FIG. 7, the PVT corner calculating unit 430 may output, depending on the status value ROD_VALUE, any one of a first corner status CORNER_STATUS1, a second corner status CORNER_STATUS2, a third corner status CORNER_STATUS3 and a fourth corner status CORNER_STATUS4, as the PVT corner value PVT_CORNER.

In an embodiment of FIG. 7, the PVT corner according to the PVT conditions is divided into N parts (N=4) to determine the PVT corner value PVT_CORNER.

Figure 8:
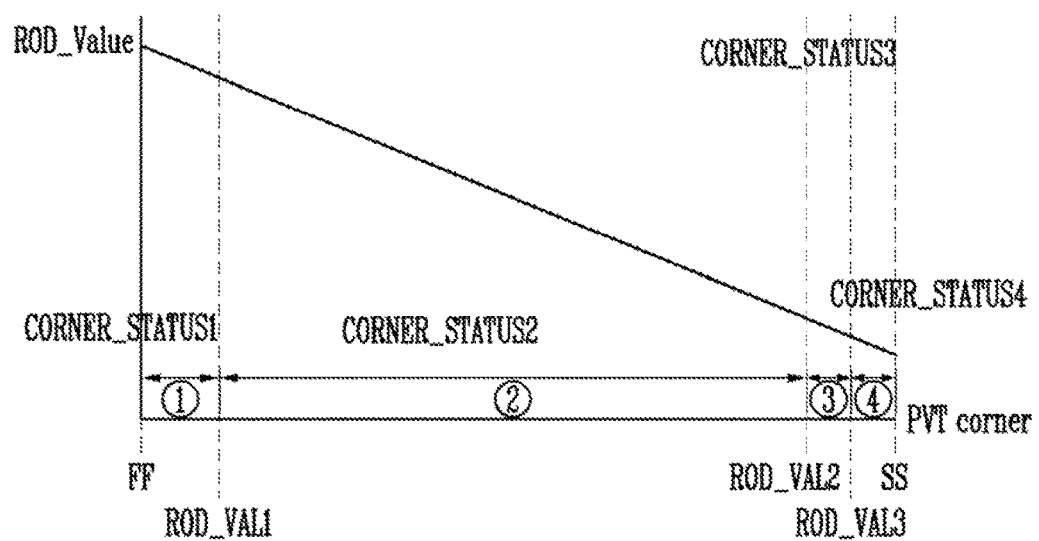
FIG. 8 is a graph illustrating an embodiment of a calculation of a PVT corner value in a PVT corner calculating unit of FIG. 4.

FIG. 8 is a graph illustrating an embodiment of calculation of the PVT corner value PVT_CORNER in the PVT corner calculating unit 430 of FIG. 4.

Referring to FIG. 8, when determined, the PVT corner value PVT_CORNER may be subdivided in a region adjacent to the slow corner SS or the fast corner FF so as to enhance characteristics of the edge side. For example, when the status value ROD_VALUE is less than ROD_VAL1, the PVT corner calculating unit 430 outputs a first corner status CORNER_STATUS1 as the PVT corner value PVT_CORNER. Furthermore, when the status value ROD_VALUE is between ROD_VAL1 and ROD_VAL2, the PVT corner calculating unit 430 outputs a second corner status CORNER_STATUS2 as the PVT corner value PVT_CORNER. When the status value ROD_VALUE is between ROD_VAL2 and ROD_VAL3, the PVT corner calculating unit 430 outputs a third corner status CORNER_STATUS3 as the PVT corner value PVT_CORNER. When the status value ROD_VALUE is larger than ROD_VAL3, the PVT corner calculating unit 430 outputs a fourth corner status CORNER_STATUS4 as the PVT corner value PVT_CORNER.

Referring again to FIG. 6, the delay trim code output unit 440 may output a final delay trim code FINAL_DELAY_TRIM_CODE based on the PVT corner value PVT_CORNER provided from the PVT corner calculating unit 430. Moreover, the delay trim code output unit 440 may select one of a plurality of delay trim codes DELAY_TRIM_CODE00, DELAY_TRIM_CODE01, DELAY_TRIM_CODE10, and DELAY_TRIM_CODE11, and output the selected one as the final delay trim code FINAL_DELAY_TRIM_CODE. The plurality of delay trim codes DELAY_TRIM_CODE00, DELAY_TRIM_CODE01, DELAY_TRIM_CODE10, and DELAY_TRIM_CODE11 may be a 2-bit preset code corresponding to the PVT corner value PVT_CORNER. Each of the delay trim codes is a code set to ensure a sufficient setup/hold margin in a corresponding PVT corner.

Figure 9:
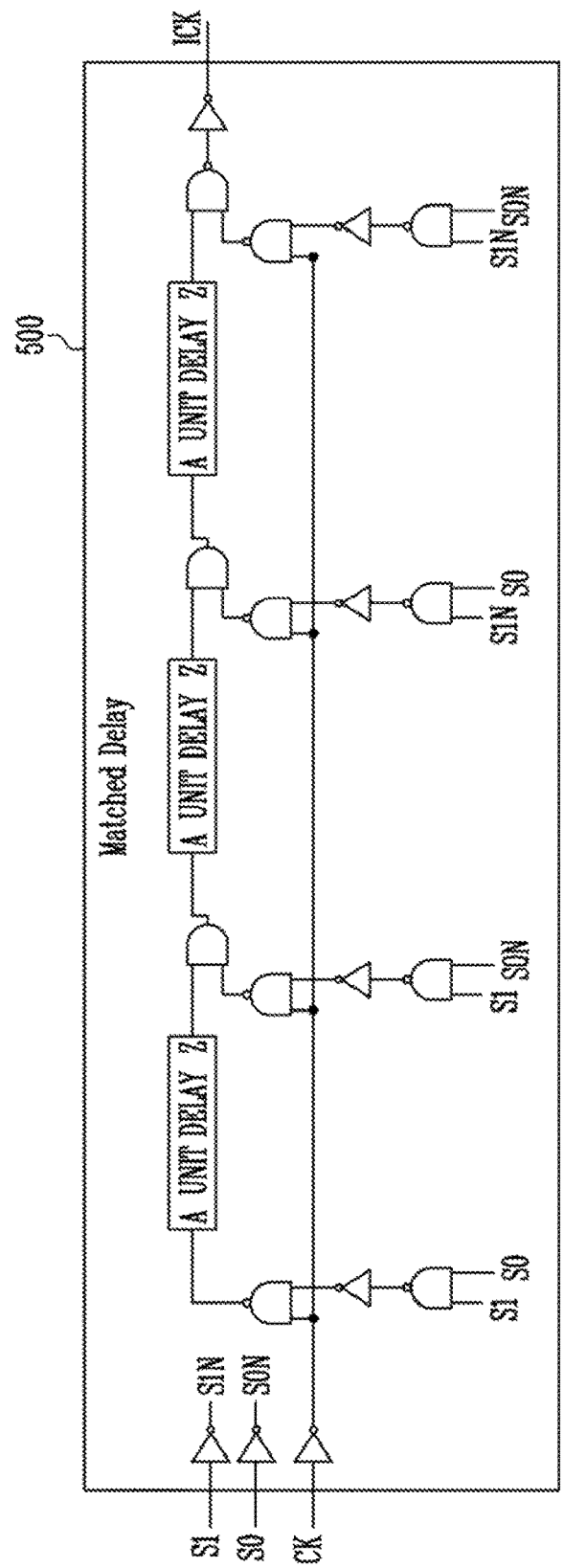
FIG. 9 is a block diagram illustrating a method for reflecting a final delay trim code on a matched delay of FIG. 6.

FIG. 9 is a block diagram illustrating a method of reflecting the final delay trim code FINAL_DELAY_TRIM_CODE on the matched delay 500 of FIG. 6.

Referring to FIG. 9, the matched delay 500 may receive the final delay trim code FINAL_DELAY_TRIM_CODE of 2-bit code as S1 and S0, the external clock CK, and output the internal clock ICK. The matched delay 500 may include a plurality of unit delays. For example, the matched delay 500 may include three unit delays. The matched delay 500 may change a delay amount depending on the final delay trim code FINAL_DELAY_TRIM_CODE and the external clock CK, and output the internal clock ICK.

Figure 10:
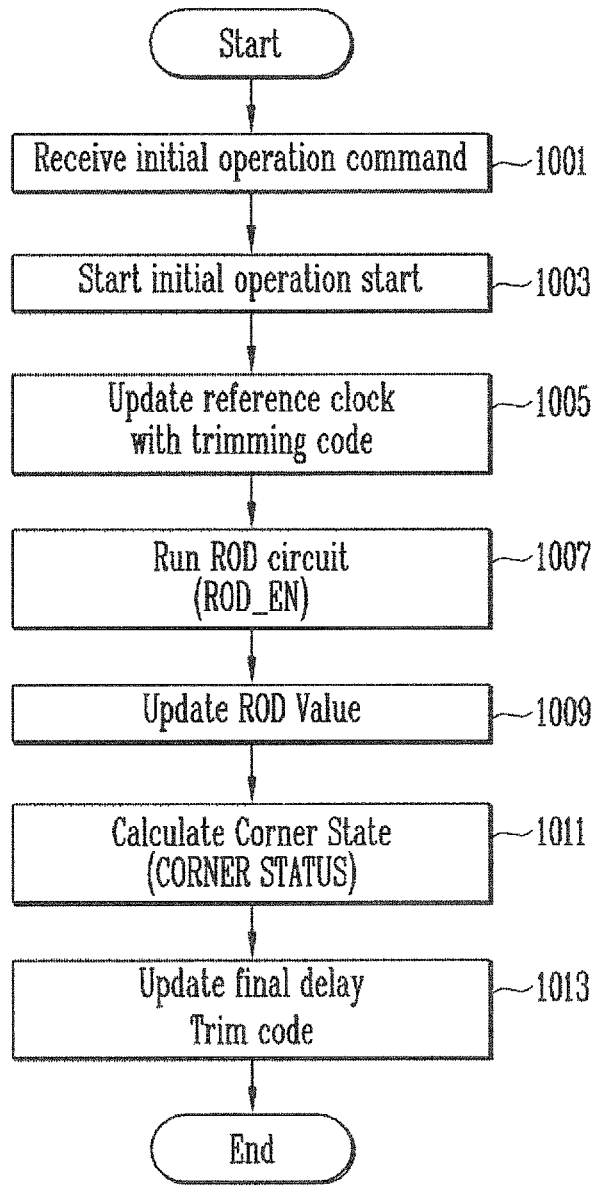
FIG. 10 is a flowchart illustrating a method for operating a semiconductor memory device according to an embodiment of the present disclosure.

FIG. 10 is a flowchart illustrating a method for operating a semiconductor memory device according to an embodiment of the present disclosure.

Referring to FIG. 10, at step 1001, the semiconductor memory device receives an initial operation command FFh. The initial operation command FFh may be a CAM auto read command which is performed after power is supplied to the semiconductor memory device.

At step 1003, the semiconductor memory device starts an initial operation in response to the initial operation command FFh.

At step 1005, the semiconductor memory device may update a reference clock included therein, based on a trimming code read from a CAM block. Thereafter, the reference clock becomes a clock signal having a constant period regardless of the PVT conditions.

At step 1007, the semiconductor memory device executes a ROD circuit. That is, the semiconductor memory device may enable a ring oscillator control signal ROD_EN. In an embodiment, after the power has been supplied and the initial operation has been performed, the semiconductor memory device may enable the ring oscillator control signal ROD_EN for a reference time tref. In an embodiment, the reference time tref may have a length corresponding to n times the period of the reference clock trimmed during the initial operation. In various embodiments, the reference time tref may be a time corresponding to ten times the period of the reference clock. For example, when a period of the trimmed reference clock refers to 100 ns, the semiconductor memory device may enable the ring oscillator control signal ROD_EN for 1 us which is ten times the period of the reference clock.

While the ring oscillator control signal ROD_EN is in an enabled status, the ROD circuit included in the semiconductor memory device may generate an oscillator clock signal ROD_Clock having a constant frequency.

At step 1009, the semiconductor memory device may count rising edges or falling edges of the generated oscillator clock signal ROD_Clock to generate a status value ROD_VALUE.

At step 1011, the semiconductor memory device calculates, based on the status value ROD_VALUE, a corner status reflecting the PVT conditions of the semiconductor memory device, and generates a PVT corner value PVT_CORNER representing the corner status.

At step 1013, the semiconductor memory device may determine any one of delay trim codes as a final delay trim code to be applied to a matched delay, depending on the PVT corner value PVT_CORNER.

According to an embodiment of the present disclosure, during an initial operation of a semiconductor memory device, a ROD circuit included therein generates a clock for a preset time. A PVT corner according to PVT conditions may be determined by counting the generated clock, whereby a delay trim code may be obtained. A stable circuit operation reflecting the PVT conditions may be embodied by inputting the delay trim code to a matched delay.

Figure 11:
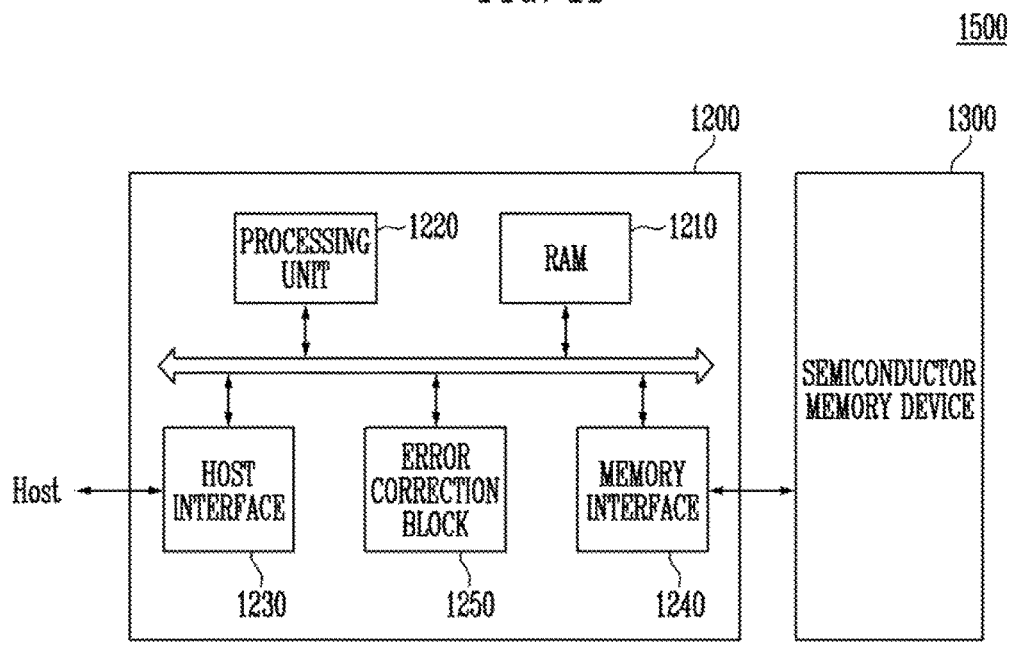
FIG. 11 is a block diagram illustrating a memory system according to an embodiment of the present disclosure.

FIG. 11 is a block diagram illustrating a memory system 1500 according to an embodiment of the present disclosure.

Referring to FIG. 11, the memory system 1500 includes the semiconductor memory device 1300 and a controller 1200.

The semiconductor memory device 1300 may have the same configuration and operation as those of the semiconductor memory device 100 described with reference to FIG. 1. Hereinafter, repetitive descriptions will be omitted.

The controller 1200 may be coupled to a host and the semiconductor memory device 1300. The controller 1200 is configured to access the semiconductor memory device 1300 in response to a request from the host. For example, the controller 1200 may control read, write, erase, and background operations of the semiconductor memory device 1300. The controller 1200 may provide an interface between the host and the semiconductor memory device 1300. The controller 1200 is configured to drive firmware for controlling the semiconductor memory device 1300.

The controller 1200 includes a random access memory (RAM) 1210, a processing unit 1220, a host interface 1230, a memory interface 1240, and an error correction block 1250.

The RAM 1210 is used as at least one of an operation memory of the processing unit 1220, a cache memory between the semiconductor memory device 1300 and the host, and a buffer memory between the semiconductor memory device 1300 and the host.

The processing unit 1220 controls the overall operation of the controller 1200.

The processing unit 1220 may perform a function of a flash translation layer (FTL). The processing unit 1220 may translate a logical block address (LBA), provided by the host, into a physical block address (PBA) through the FTL. The FTL may receive the LBA using a mapping table and translate the LBA into the PBA. Address mapping methods performed through the FTL include various methods according to a mapping unit. Representative address mapping methods include a page mapping method, a block mapping method, and a hybrid mapping method.

The processing unit 1220 is configured to randomize data received from the host. For example, the processing unit 1220 may use a randomizing seed to randomize data received from the host. The randomized data is provided, as data to be stored, to the semiconductor memory device 1300 and is then programmed in the memory cell array.

The processing unit 1220 is configured to derandomize data received from the semiconductor memory device 1300 during a read operation. For example, the processing unit 1220 may use a derandomizing seed to derandomize data received from the semiconductor memory device 1300. Derandomized data may be output 5 to the host.

In an embodiment, the processing unit 1220 may drive a software or firmware to perform the randomizing or derandomizing operation.

The host interface 1230 may include a protocol for performing data exchange between the host and the controller 1100. In an example of an embodiment, the controller 1200 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1240 interfaces with the semiconductor memory device 1300. For example, the memory interface includes a NAND interface or a NOR interface.

The error correction block 1250 uses an error correcting code (ECC) to detect and correct an error in data received from the semiconductor memory device 1300.

The error correction block 1250 generates parity, which is an error correction code (ECC) for data to be programmed. Furthermore, during a read operation, the error correction block 1250 may correct an error using parity for read page data. The error correction block 1250 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

During a read operation, the error correction block 1250 may correct errors from read page data. When a number of error bits exceeding the number of correctable bits are included in the read page data, decoding may fall. When a number of error bits less than or equal to the number of correctable bits are included in the page data, decoding may succeed.

A success in decoding indicates that the corresponding read command has passed. A failure in decoding indicates that the corresponding read command has failed. When decoding succeeds, the controller 1200 outputs error-corrected page data to the host.

The controller 1200 and the semiconductor memory device 1300 may be integrated into a single semiconductor device. In an example of an embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCMCIA), a compact flash card (CF), a smart media card (SM or SMC), a memory stick multimedia card (for example, MMC, RS-MMC, or MMCmicro), a SD card (for example, SD, miniSD, microSD, or SDHC), a universal flash storage (UFS), and the like.

The controller 1200 and the semiconductor memory device 1300 may be integrated into a single semiconductor device to form a solid state drive (SSD). The SSD includes a storage device formed to store data in a semiconductor memory. When the memory system is used as the SSD, an operation speed of the host coupled to the memory system may be phenomenally improved.

In an embodiment, the memory system may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 1300 or the memory system may be embedded in various types of packages. For example, the semiconductor memory device 1300 or the memory system may be packaged in a type such as Package on Package (POP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 12:
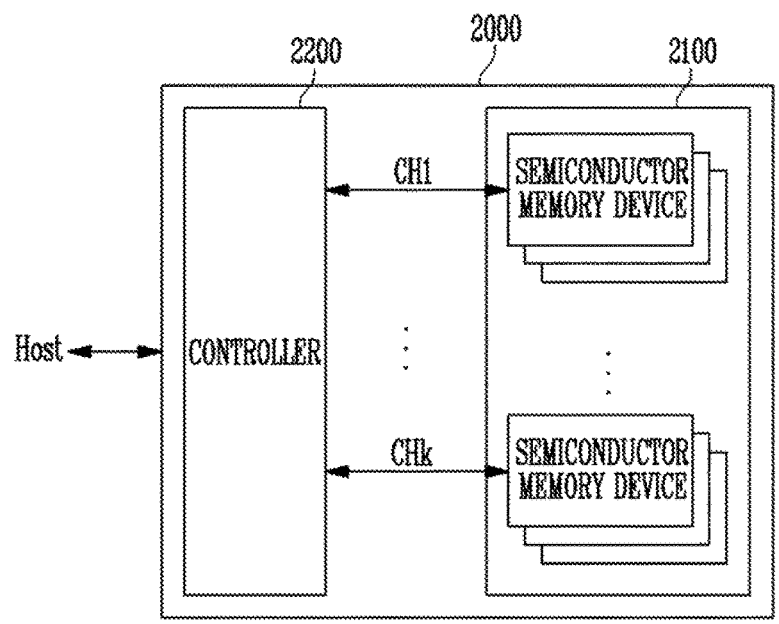
FIG. 12 is a block diagram illustrating a memory system according to an embodiment of the present disclosure.

FIG. 12 is a block diagram illustrating a memory system 2000 according to an embodiment of the present disclosure.

Referring to FIG. 12, the memory system 2000 includes a semiconductor memory device 2100 and a controller 2200. The semiconductor memory device 2100 includes a plurality of memory chips. The semiconductor memory chips are divided into a plurality of groups.

Referring to FIG. 12, it is illustrated that each of the plurality of groups communicates with the controller 2200 through first to k-th channels CH1 to CHk. Each semiconductor memory chip may have the same configuration and operation as those of an embodiment of the semiconductor memory device 100 described with reference to FIG. 1.

Each group communicates with the controller 2200 through one common channel. The controller 2200 has the same configuration as that of the controller 1200 described with reference to FIG. 11 and is configured to control a plurality of memory chips of the semiconductor memory device 2100 through the plurality of channels CH1 to CHk.

In FIG. 12, a plurality of semiconductor memory chips are illustrated as being connected to each channel. However, it will be understood that the memory system 2000 may be modified such that a single memory chip is connected to each channel.

Figure 13:
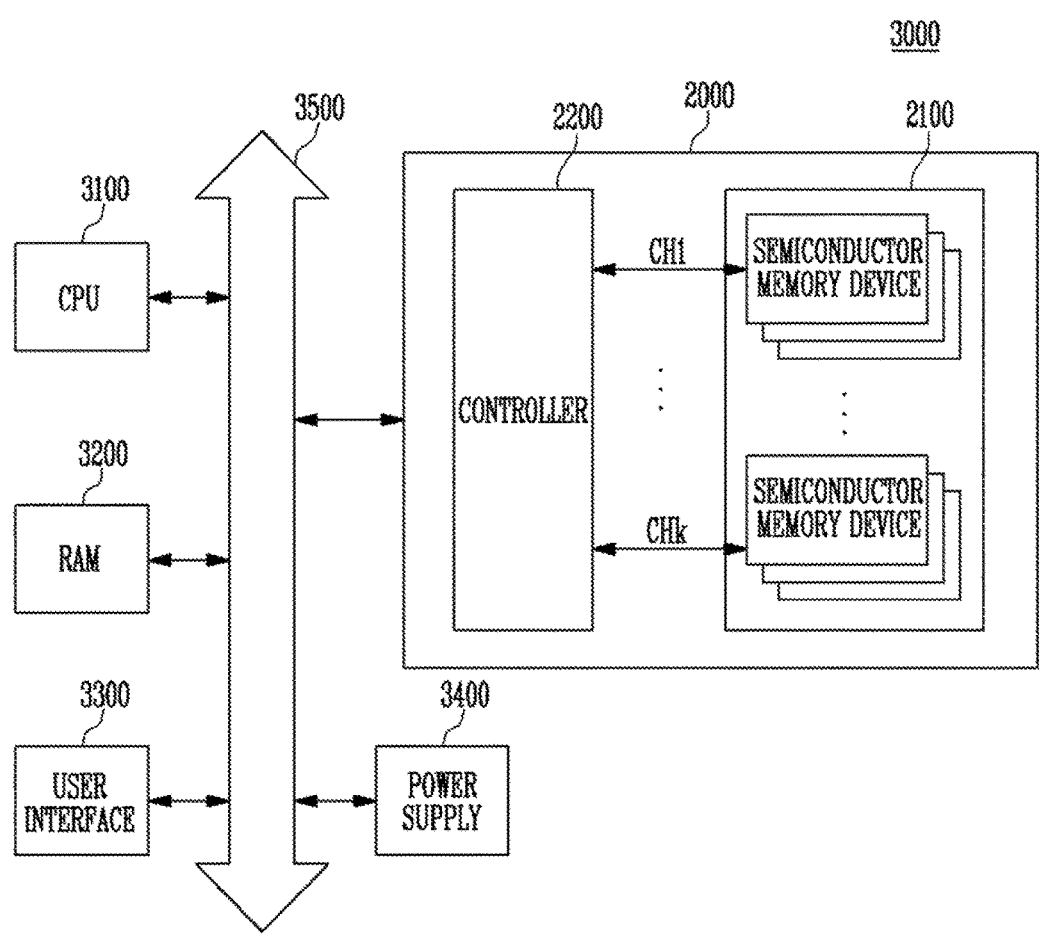
FIG. 13 is a block diagram illustrating a computing system including the memory system of FIG. 12, according to an embodiment of the present disclosure.

FIG. 13 is a block diagram illustrating a computing system 3000 including the memory system 2000 of FIG. 12, according to an embodiment of the present disclosure.

Referring to FIG. 13, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

Referring to FIG. 13, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

Referring to FIG. 13, the memory system described with reference to FIG. 12 may be provided. However, the memory system 2000 may be replaced with the memory system 1500 described with reference to FIG. 11. In an embodiment, the computing system 3000 may include all of the memory systems 1500 and 2000 described with reference to FIGS. 11 and 12.

According to an embodiment of the present disclosure, a semiconductor memory device capable of more stable operation and a method for operating the same are provided.

Although the embodiments of the present disclosure have been disclosed, those skilled in the art will appreciate that various modifications, additions and substitutions are possible, without departing from the scope and spirit of the invention.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not always be performed in regular order. Furthermore, the embodiments disclosed in the present specification and the drawings aim to help those with ordinary knowledge in this art more clearly understand the present disclosure rather than aiming to limit the bounds of the present disclosure. That is, one of ordinary skill in the art to which the present disclosure belongs will be able to easily understand that various modifications are possible based on the technical scope of the present disclosure.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
a delay code determining unit configured to output a final delay trim code reflecting process, voltage and temperature (PVT) conditions of the semiconductor memory device, using an internal clock generated for a reference time; and
a delay circuit configured to reflect a delay of a data line on a clock signal in response to the final delay trim code,
wherein the reference time is determined to have a length corresponding to n times a period of a reference clock, n being a positive integer.

2. The semiconductor memory device according to claim 1, wherein the delay code determining unit comprises:
an oscillator configured to output the internal clock in response to a control signal;
a clock counting unit configured to count rising or falling edges of the internal clock and output a status value;
a PVT corner calculating unit configured to output a PVT corner value reflecting the PVT conditions of the semiconductor memory device using the status value; and
a delay code output unit configured to output one of a plurality of delay trim codes as the final delay trim code, in response to the PVT corner value.

3. The semiconductor memory device according to claim 2, wherein the control signal is inputted for the reference time, after power is supplied to the semiconductor memory device and an initial operation is performed.

4. The semiconductor memory device according to claim 2, wherein the status value is reduced as a PVT corner of the semiconductor memory device nears a slow corner.

5. The semiconductor memory device according to claim 2, wherein the PVT corner calculating unit calculates the PVT corner value based on variation of the status value depending on the PVT conditions of the semiconductor memory device.

6. The semiconductor memory device according to claim 1, wherein the reference clock is generated in response to a trimming code which is read from a content addressable memory (CAM) block when power is supplied.

7. The semiconductor memory device according to claim 1, wherein the reference time is a time corresponding to ten times the period of the reference clock included in the semiconductor memory device.

8. A method for operating a semiconductor memory device, comprising:
    reading a trimming code from a content addressable memory (CAM) block when power is supplied, and generating a reference clock according to the trimming code;
    generating an internal clock for a reference time, and determining a final delay trim code reflecting process, voltage and temperature (PVT) conditions of the semiconductor memory device based on the internal clock; and
    generating a delayed clock signal obtained by delaying an external clock by a delay of a data line based on the final delay trim code,
    wherein the reference time is determined to have a length corresponding to n times a period of the reference clock, n being a positive integer.

9. The method according to claim 8, wherein the determining of the final delay trim code comprises:
    generating the internal clock in response to a control signal;
    generating a status value obtained by counting rising or falling edges of the internal clock; and
    determining the final delay trim code based on the status value.

10. The method according to claim 9, wherein the determining of the final delay trim code based on the status value comprises:
    calculating a PVT corner value that reflects the PVT conditions of the semiconductor memory device using the status value; and
    outputting one of a plurality of delay trim codes as the final delay trim code, in response to the PVT corner value.

11. The method according to claim 10, wherein the calculating comprises calculating the PVT corner value based on variation of the status value depending on the PVT conditions of the semiconductor memory device.

12. The method according to claim 9, wherein the status value is reduced as a PVT corner of the semiconductor memory device nears a slow corner.

13. The method according to claim 9, wherein the control signal is inputted for the reference time, after the power is supplied to the semiconductor memory device and an initial operation is performed.

14. The method according to claim 8, wherein the reference time is a time corresponding to ten times the period of the reference clock.

* * * * *